(12) United States Patent
Zang et al.

(10) Patent No.: US 9,984,932 B1
(45) Date of Patent: May 29, 2018

(54) SEMICONDUCTOR FIN LOOP FOR USE WITH DIFFUSION BREAK

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days. days.

(21) Appl. No.: 15/345,612

(22) Filed: Nov. 8, 2016

(51) Int. Cl.
| | |
|---|---|
| *H01L 21/762* | (2006.01) |
| *H01L 21/8234* | (2006.01) |
| *H01L 27/088* | (2006.01) |
| *H01L 29/06* | (2006.01) |
| *H01L 29/66* | (2006.01) |

(52) U.S. Cl.
CPC ........ *H01L 21/823431* (2013.01); *H01L 21/823418* (2013.01); *H01L 21/823481* (2013.01); *H01L 27/0886* (2013.01); *H01L 29/0657* (2013.01); *H01L 29/66545* (2013.01)

(58) Field of Classification Search
CPC ..... H01L 21/823431; H01L 21/823418; H01L 21/823481; H01L 27/0886; H01L 29/0657; H01L 29/66545
See application file for complete search history.

(56) References Cited

U.S. PATENT DOCUMENTS

| | | | |
|---|---|---|---|
| 8,846,491 | B1 | 9/2014 | Pham et al. |
| 8,916,460 | B1 | 12/2014 | Kwon et al. |
| 9,105,685 | B2 * | 8/2015 | Lin ................. H01L 21/76224 |
| 2014/0117454 | A1 | 5/2014 | Liu et al. |
| 2016/0190130 | A1 | 6/2016 | Yu et al. |

* cited by examiner

*Primary Examiner* — Long Pham
(74) *Attorney, Agent, or Firm* — Yuanmin Cai; Hoffman Warnick LLC

(57) ABSTRACT

A finFET includes a source or a drain including: a first semiconductor fin extending parallel to a second semiconductor fin, and a semiconductor connector fin creating a first semiconductor fin loop by connecting an end of the first semiconductor fin to an end of the second semiconductor fin. A diffusion break isolates the source or the drain, and is positioned about the first semiconductor connector fin and the ends of the first semiconductor fin and the second semiconductor fin. The semiconductor connector fin provides an epitaxial growth surface adjacent the diffusion break. A related method and IC structure are also disclosed.

13 Claims, 19 Drawing Sheets

SEMICONDUCTOR FIN LOOP FOR USE WITH DIFFUSION BREAK

BACKGROUND

The present disclosure relates to fin-shaped field effect transistors (finFETs), and more specifically, to use of a semiconductor fin loop for a diffusion break.

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (with both n-type MOS (NMOS) and p-type MOS (PMOS) transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered, and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode together may sometimes be referred to as the gate stack structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit, device designers have greatly reduced the physical size of FETs over the years. More specifically, the channel length of FETs can be scaled down significantly (i.e., channel length decreased), which can improve the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected (e.g., by larger leakage current) by the electrical potential of the drain. This is sometimes referred to as a so-called short channel effect, wherein the characteristic of the FET as an active switch is degraded.

In contrast to a FET, which has a planar structure, a so-called finFET device has a three-dimensional (3D) structure. FIG. 1A is a side view of an illustrative prior art finFET semiconductor device 10 that is formed above a semiconductor substrate 12. In this example, finFET device 10 includes three illustrative fins 14, a gate structure 16, sidewall spacers 18, and a gate cap 20. Gate structure 16 is typically comprised of a layer of insulating material (not separately shown), e.g., a layer of high-k insulating material or silicon dioxide, and one or more conductive material layers (e.g., metal, metal nitride, and/or polysilicon) that serve as the gate electrode and work-function layers (for setting threshold voltage (Vt)) for device 10. Fins 14 have a three-dimensional configuration. The portions of fins 14 covered by gate structure 16 is the channel region of finFET device 10, which is also in a three-dimensional configuration. An isolation structure 22 is formed between fins 14. In a conventional process flow, the portions of fins 14 that are positioned outside of spacers 18, i.e., in the source/drain regions of the device 10, may be increased in size (i.e., width and height) or even merged together by performing one or more epitaxial growth processes. The process of increasing the size of fins 14 in the source/drain regions of device 10 is performed to reduce the resistance of source/drain regions and/or make it easier to establish electrical contact to the source/drain regions.

A particular fin 14 may be used to fabricate multiple devices. FIG. 1B illustrates a cross-sectional view of finFET device 10 along the length of one fin 14 prior to the formation of any gate structures 16. One or more diffusion breaks 30, 32 are formed along the axial length of fin 14 to define separate fin portions by removing a portion of fin 14 and replacing it with a dielectric material. The strength of the isolation provided by diffusion break 30, 32 depends on its size. A diffusion break having a wider lateral width (in the current transport direction, or gate length (GL) direction of the completed devices) corresponding to the lateral width of two adjacent gate structures 16 (later formed) is referred to as a double diffusion break (DDB) 30, and a diffusion break having a lateral width corresponding to the lateral width of one gate structure 16 is referred to as a single diffusion break (SDB) 32. The specific process for forming the single diffusion break may intentionally gouge fin 14 and define recesses 34 (for reasons described herein). As illustrated, each diffusion break includes an isolation region made of a dielectric.

FIG. 1C illustrates device 10 after a plurality of processes were performed to define a plurality of gate structures 16, with cap layers 20, and sidewall spacers 18 above fin 14. A gate structure formed over SDB 32 is often referred to as a dummy gate 36, since it is not over active semiconductor material but dielectric. Spacers 38 surround dummy gate 36.

FIGS. 1D-1F show processes to enlarge source/drain regions in fin 14. FIG. 1D illustrates device 10 after a self-aligned etch process was performed to recess fin 14 using the gate structures 16 and spacers 18 as an etch mask to define recesses 40, 42 in fin 14. Because of the fin gouging, recesses 40 adjacent the single diffusion break 32 are deeper than the other recesses 40. FIGS. 1E-1F illustrate device 10 after an epitaxial growth process was performed to define epitaxial regions 62, 70 (FIG. 1E) in recesses 40, 42 (FIG. 1D) for source and drain 70, 72 (FIG. 1F) of device 10, respectively. In some instances, source/drain 70, 72 are raised compared to a top surface of fin 14. Ideally, after the recessing, some semiconductor material remains under dummy gate 36 and spacers 38 thereof to allow formation of well-defined sources/drains 70, 72. As shown in FIG. 1E, however, where some, but too little, semiconductor material of fin 14 remains under edges of dummy gate 36 and spacers 38 thereof, source/drain 70, 72 of device 10 suffer from poor epi growth under the edges and leakage between source/drain 70, 72 through dummy gate 36. In addition, as shown in FIG. 1F, during formation, dielectric for SDB 32 may be larger than a width of dummy gate 36 and spacers 38. In this case, the semiconductor material of fin 14 may not remain present under dummy gate 36 and spacers 38 thereof, which prevents epitaxy (epi) growth for source/drain 70, 72 from growing under dummy gate 36 and spacers 38. Here, source/drain 70, 72 grow in a poor manner, resulting in asymmetric growth without ideal facets. This situation is especially problematic when trying to land source and drain contacts on epi of source/drain 70, 72, e.g., because not enough surface area is generated of the source or drain. In this case, the contact area will not be positioned as high as desired, which may result in current crowding issues. Further, the structure of device 10 still provides a potential leakage path through dummy gate 36.

One approach to attempt to address this concern includes employing a T-shaped isolation trench for SDB 32 (i.e. the slight recess 34 in FIG. 1B or 1C, and later filled with dielectrics 32). However, this approach creates a number of additional challenges such as asymmetric source and drains that are non-communicative, or the isolation trench blocking epitaxy growth that forms the source/drain. Another approach attempts to form the SDB after formation of the active finFETs, which adds complexity and numerous processing steps. In either approach, one is likely to create a poorly functioning or inoperative device.

SUMMARY

A first aspect of the disclosure is directed to a fin-type field effect transistor (finFET), including: a source or a drain including: a first semiconductor fin extending parallel to a second semiconductor fin, and a first semiconductor connector fin creating a first semiconductor fin loop by connecting an end of the first semiconductor fin to an end of the second semiconductor fin; and a first diffusion break isolating the source or the drain, the first diffusion break positioned about the first semiconductor connector fin and the ends of the first semiconductor fin and the second semiconductor fin.

A second aspect of the disclosure includes an integrated circuit (IC) structure, including: a source of a first fin-type field effect transistor (finFET) including a first pair of semiconductor fins having ends thereof connected by a first semiconductor connector fin; a drain of a second finFET including a second pair of semiconductor fins having ends thereof connected by a second semiconductor connector fin; and a single diffusion break (SDB) isolating the source and the drain, the SDB extending along sides of each of the first and second semiconductor connector fins.

A third aspect of the disclosure related to a method of forming a fin field effect transistor (finFET) with a diffusion break, the method including: forming, from a semiconductor substrate, a pair of spaced semiconductor fins having ends thereof coupled by a semiconductor connecting fin, creating a semiconductor fin loop; forming a barrier layer over the semiconductor fin loop; forming an isolation region layer about the semiconductor fin loop; forming a diffusion break about the semiconductor fin loop and over the isolation region layer, leaving an exposed portion of the pair of spaced semiconductor fins; stripping the barrier layer from the exposed portion of the pair of spaced semiconductor fins; and forming a plurality of gate structures over the exposed portion of the pair of spaced semiconductor fins, including a dummy gate structure over the diffusion break and the semiconductor connecting fin.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1A:
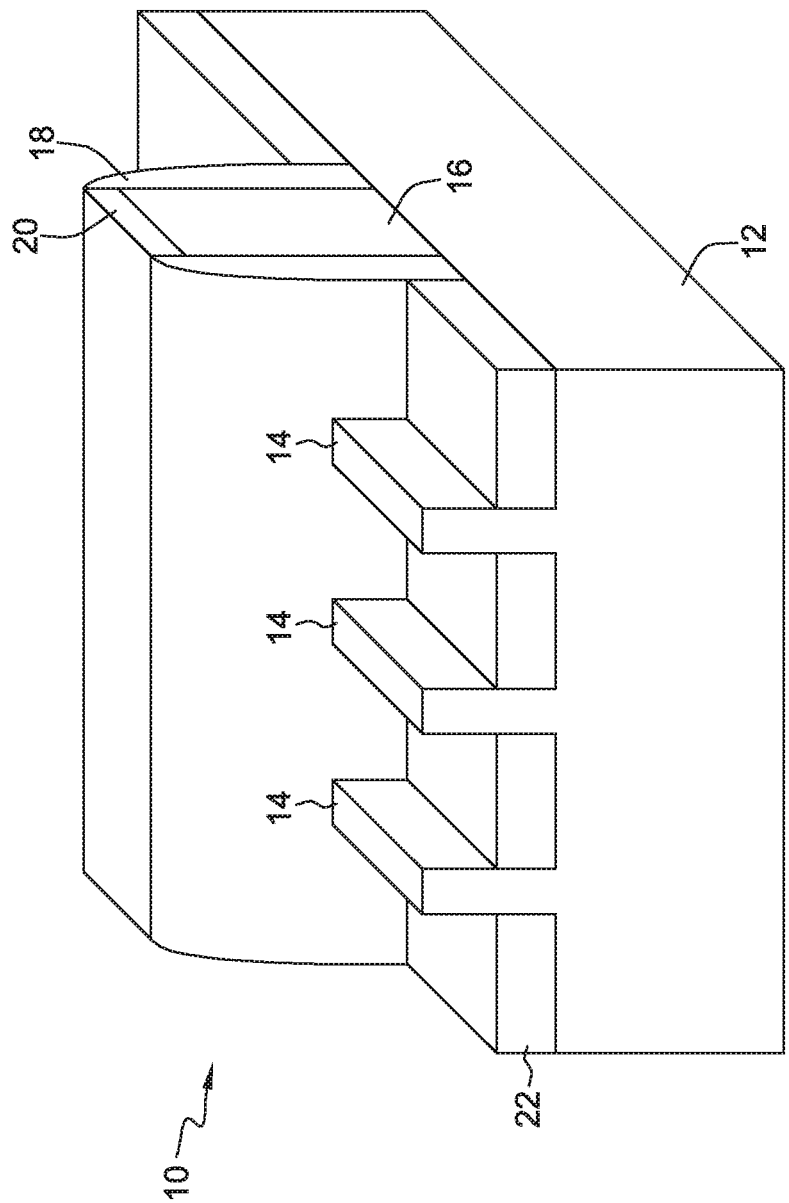
FIG. 1A shows a perspective view of a finFET according to the prior art.
Figure 1B:
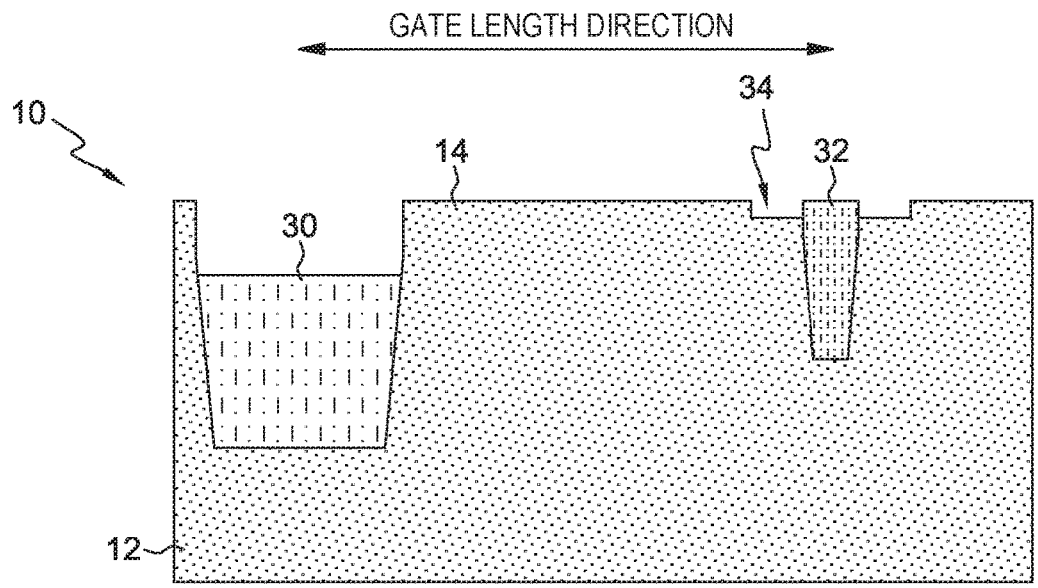
FIGS. 1B-1F show cross-sectional views of formation of a finFET according to the prior art.
Figure 1C:
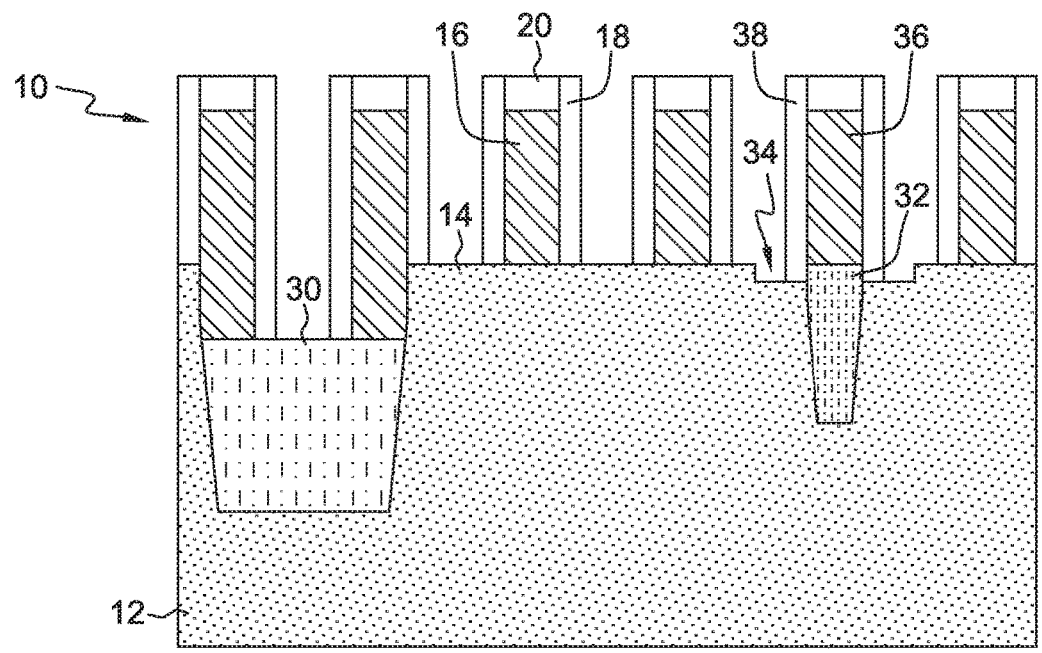
Figure 1D:
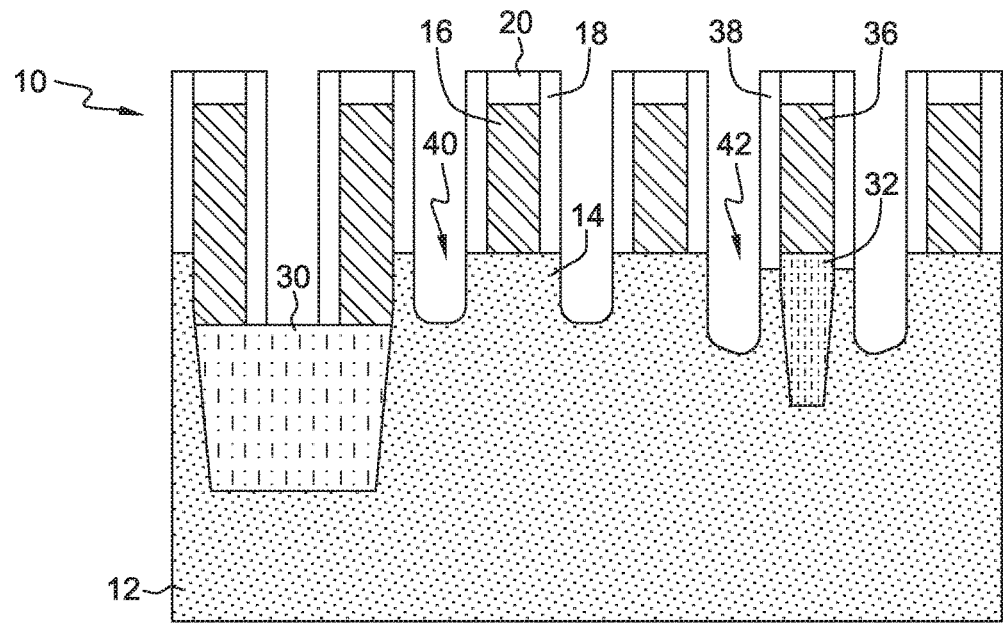
Figure 1E:
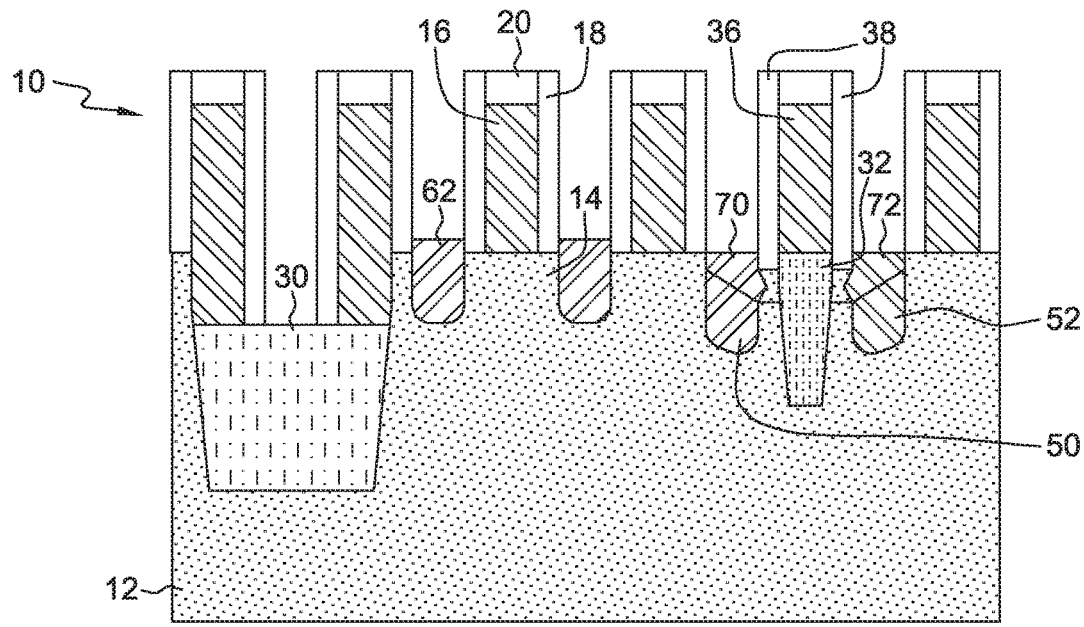
Figure 1F:
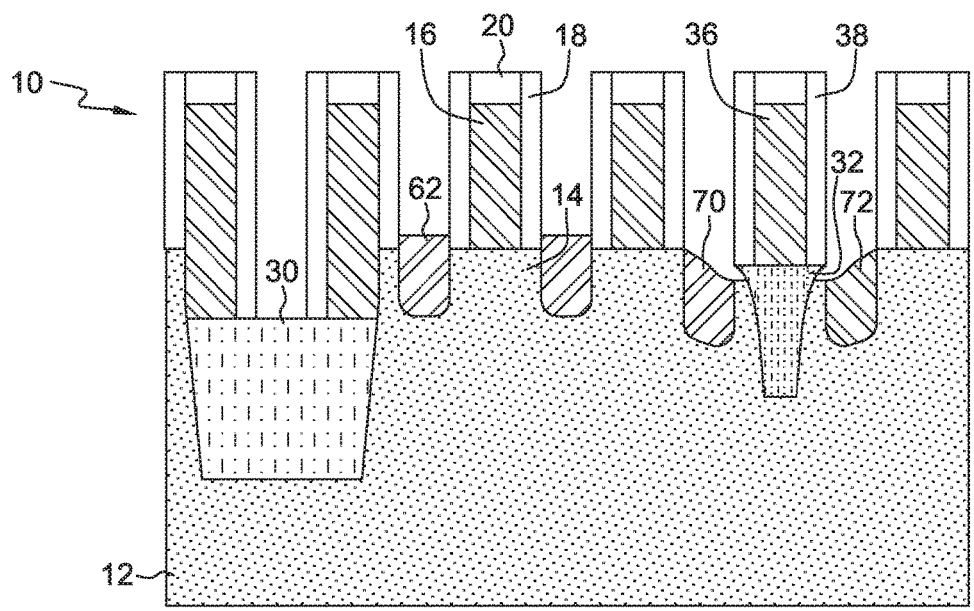

The disclosure discloses use of a semiconductor connector fin operatively coupling ends of a pair of semiconductor fins, thereby creating a semiconductor fin loop. The pair of semiconductor fins can be used to form a variety of finFETs, e.g., a double fin, single finFET for logic gates, or a four fin, single finFET for memory cells, among other finFET structures. In any event, a finFET according to embodiments of the disclosure may include a source and/or a drain including: a first semiconductor fin extending parallel to a second semiconductor fin, and a semiconductor connector fin creating a semiconductor fin loop by connecting an end of the first semiconductor fin to an end of the second semiconductor fin. A diffusion break isolates the source or the drain, i.e., from other source/drains, and is positioned about the semiconductor connector fin and the ends of the first semiconductor fin and the second semiconductor fin.

As will be described, the semiconductor fin loop, and in particular, the connector fin provide an epitaxial growth surface adjacent the diffusion break that addresses the misalignment and etching issues described herein that exist relative to source/drain epitaxy. Specifically, the semiconductor fin loop allows for formation of a diffusion break over the loop. When a dummy gate is formed thereover and later used for etching the fins for subsequent source/drain epitaxial growth, the semiconductor connector fin remains present under the dummy gate. End faces of the semiconductor connector fin thus remain present for source/drain epitaxial growth. End faces of the semiconductor fin remain even if the dummy gate is a little misaligned over the diffusion break.

As used herein, the terms "epitaxy," "epitaxial growth," and "epitaxially formed and/or grown" mean the growth of a semiconductor material on a surface of a semiconductor material, in which the semiconductor material being grown may have the same crystalline characteristics as the semiconductor material of the surface. In an epitaxial growth process, the chemical reactants provided by the source gases are controlled and the system parameters are set so that the depositing atoms arrive at the surface of the exposed semiconductor material with sufficient energy to move around on the surface and orient themselves to the crystal arrangement of the atoms of the surface. Therefore, an epitaxial semiconductor material may have the same crystalline characteristics as the surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Turning to FIGS. 2-16, a method of forming a finFET 100A, 100B (FIGS. 15-16) and an IC structure 102 (FIGS. 15-16) with a diffusion break 160 according to embodiments of the disclosure will now be described.

Figure 2:
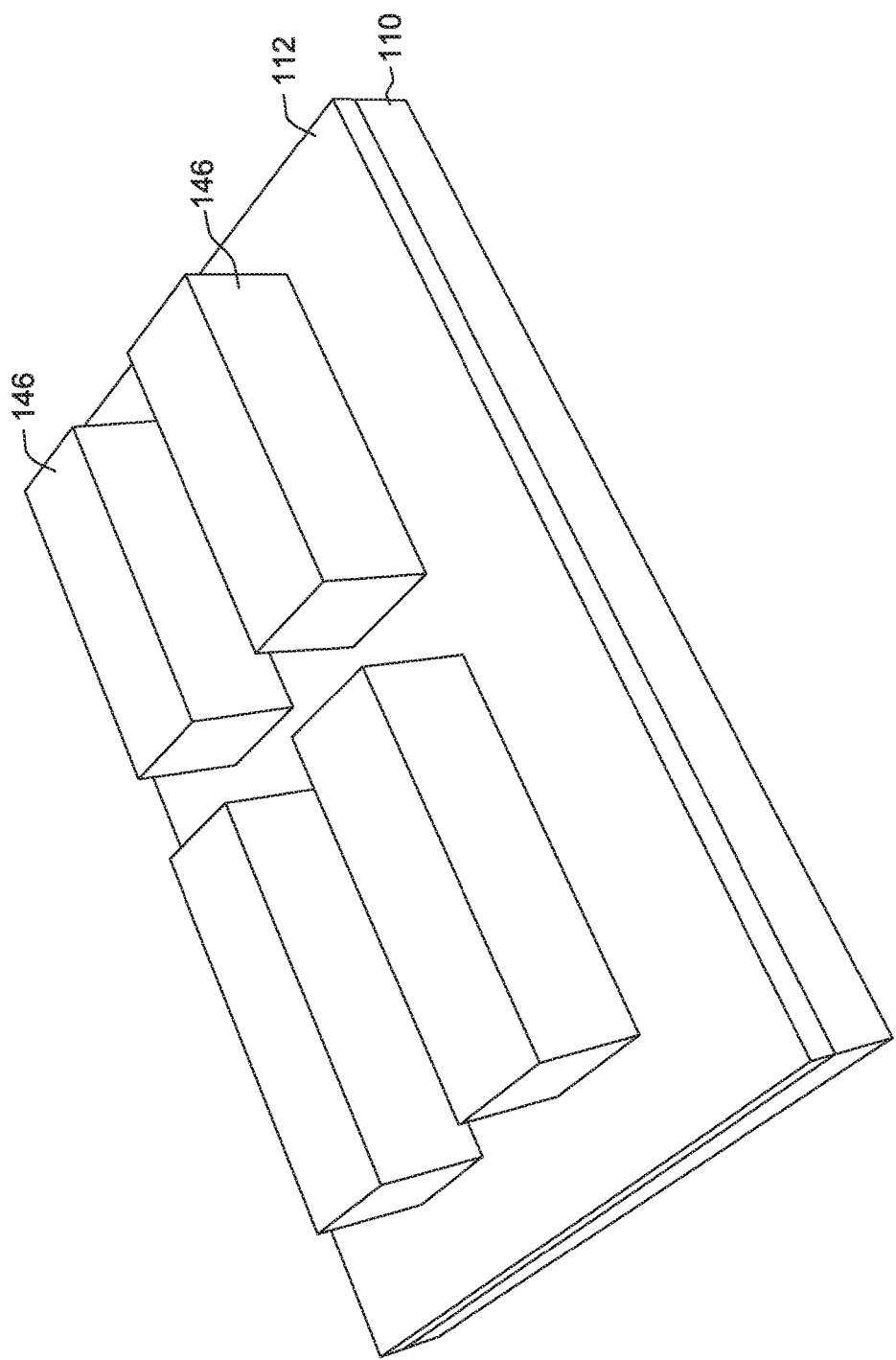
FIG. 2 shows a perspective view of a semiconductor substrate having a hard mask layer and a mandrel thereover according to embodiments of the disclosure.
Figure 3:
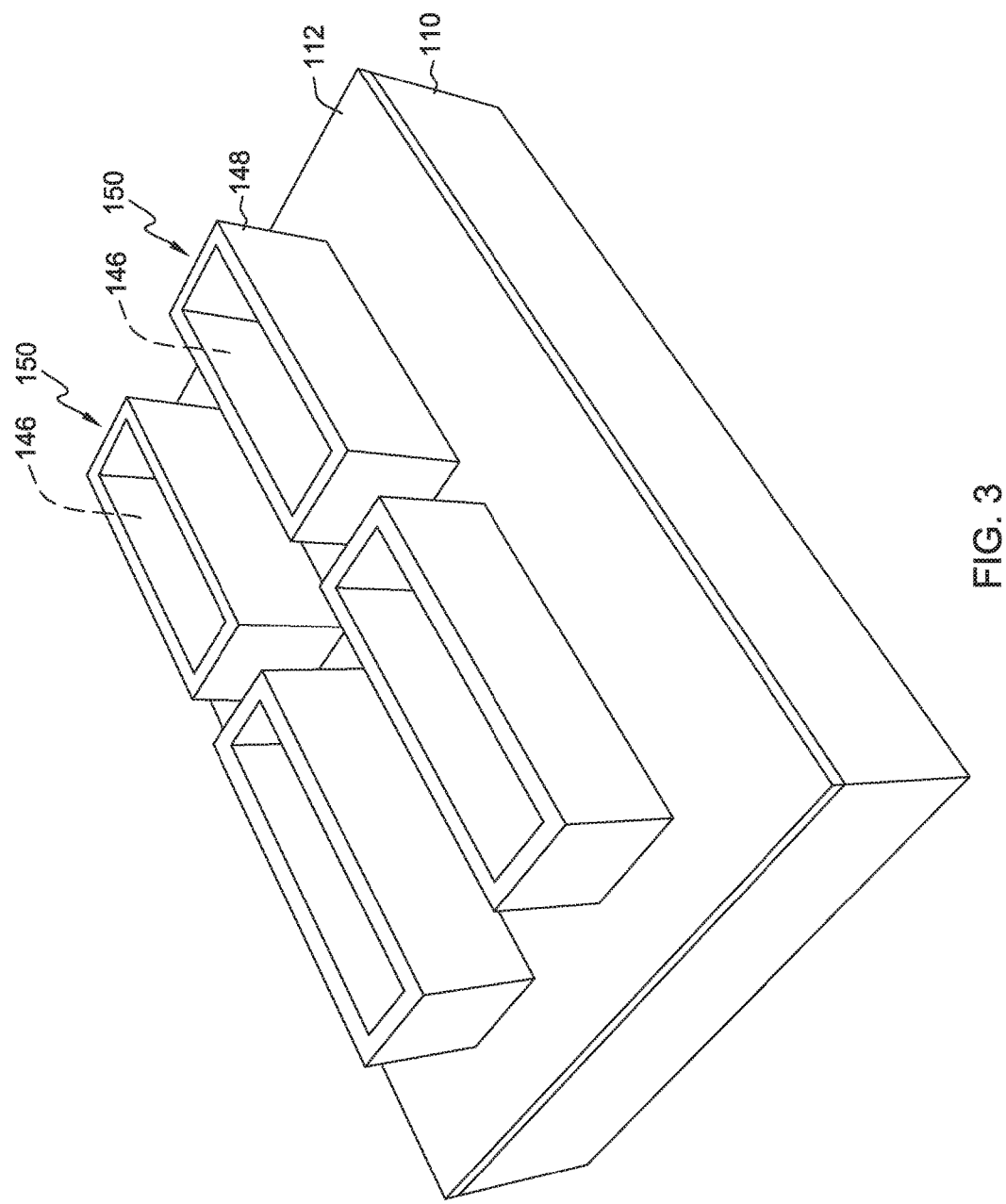
FIG. 3 shows a perspective view of a mask for forming a semiconductor fin loop according to embodiments of the disclosure.
Figure 4:
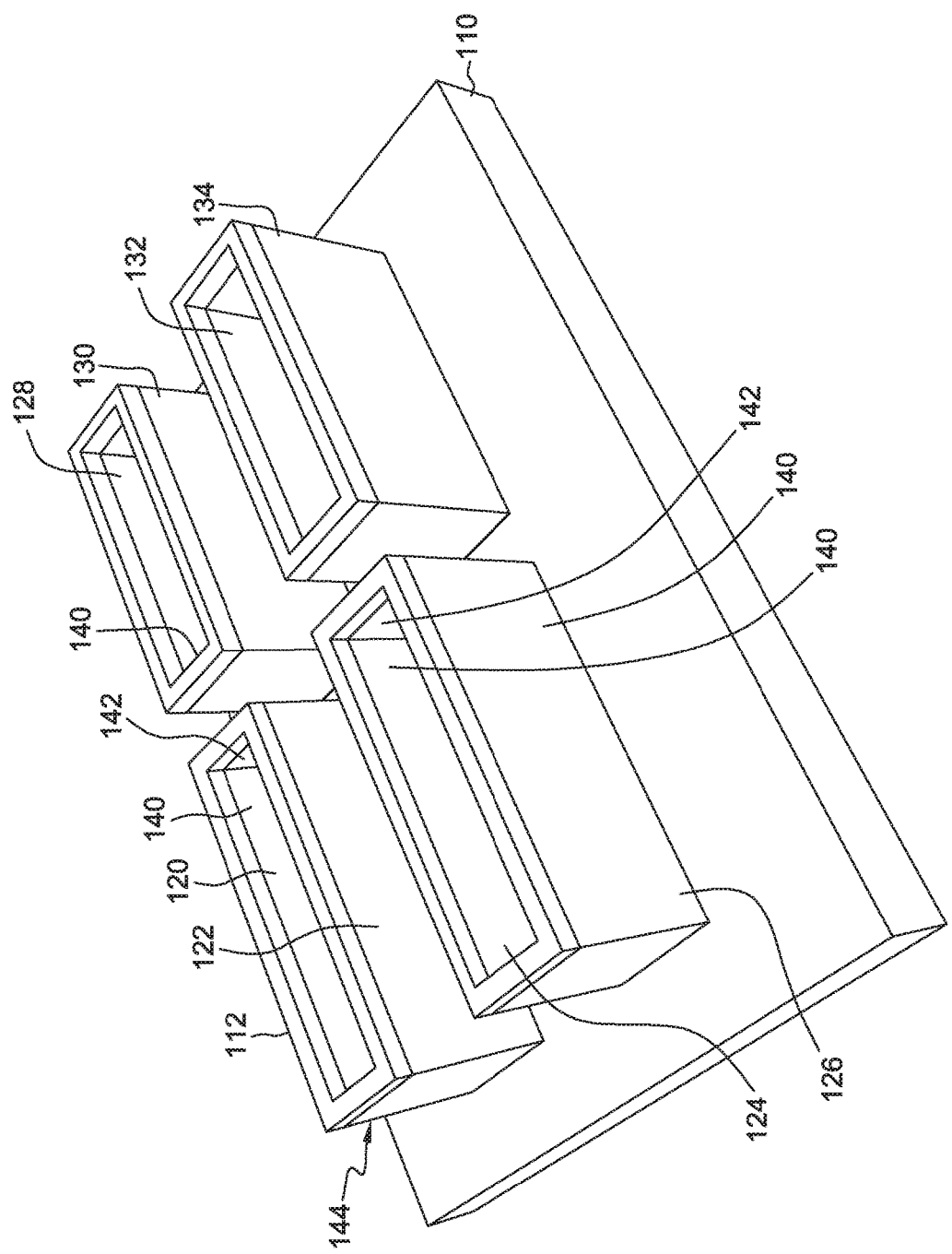
FIG. 4 shows a perspective view of semiconductor fin loops and semiconductor connecting fins according to embodiments of the disclosure.

In FIGS. 2-4, perspective views of forming a pair of spaced semiconductor fins 120 and 122 (FIG. 4) having ends 140 (FIG. 4) thereof coupled by a semiconductor connecting fin 142 (FIG. 4) are provided. Semiconductor fins 120, 122 and semiconductor connecting fin 142 may be formed from a semiconductor substrate 110 by using the usual sidewall image transfer (SIT) method (i.e. forming mandrel pattern first, followed by forming spacers along mandrel sides as hard-mask, then removing mandrel, and etching down to substrate for forming fins). The forming of loop 144 is in contrast to conventional finFET formation that uses open ended fins (by intentionally etching the fin end with an extra mask). Conventionally, the fin-ends and connecting fins are considered as "un-desirable." However, according to embodiments of the disclosure, the fin ends are intentionally retained and utilized for forming diffusion breaks. In this way, a simpler process fin formation (i.e., with no need for extra masking steps for "cutting" fin ends) and a simpler SDB formation (i.e., no need for "T-shape" isolation structure) are provided. In the perspective view of FIG. 4, four pairs of semiconductor fins 120, 122; 124, 126; 128, 130; and 132, 134, each with their own semiconductor connecting fin on an inner ends thereof, are provided. (Although not labeled for clarity, and not always necessary, outward ends of pairs of fins, e.g., 120, 122, may also include a semiconductor connecting fin). As understood in the art, pairs of fins provide for a variety of finFET structures to be formed. For example, pairs of semiconductor fins can be used to form a double fin, single finFET for logic gates, or a four fin, single finFET for memory cells, among other finFET structures. Large finFETs can be similarly formed by using multiple fin pairs for strong current capability. For description purposes, only semiconductor fins 120, 122 will be described unless otherwise necessary. Semiconductor fins 120, 122, and connecting fin 142 may be formed using sidewall image transfer (SIT) techniques. As understood in the art, SIT techniques allow formation of sub-lithographic structures (e.g., <20 nanometers) using photolithographic processes.

FIG. 2 shows a perspective view of semiconductor substrate 110 having a hard mask layer 112 formed thereover. Substrate 110 may include but is not limited to silicon, germanium, silicon germanium, silicon carbide, gallium nitride, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1being a total mole quantity). Substrate 110 may also include a semiconductor-on-insulator (SOI) layer of an SOI substrate. Furthermore, a portion or the entire semiconductor substrate 110 may be strained. Hard mask layer 112 may include any now known or later developed hard mask material such as but not limited to silicon nitride, silicon dioxide, carbon, etc.

Hard mask layer 112 may be formed using any now known or later developed deposition technique. "Depositing" or "deposition" may include any now known or later developed techniques appropriate for the material to be formed including but are not limited to, for example: chemical vapor deposition (CVD), low-pressure CVD (LPCVD), plasma-enhanced CVD (PECVD), sub-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 2 also shows forming a mandrel 146 over hard mask layer 112. Mandrel 146 may be formed by depositing a mandrel material layer such as but not limited to amorphous silicon. The mandrel material layer is then patterned and etched using conventional photolithography techniques. In lithography (or "photolithography"), a radiation or photo sensitive "resist" coating is formed over one or more layers which are to be treated, in some manner, such as to be selectively doped, etched, and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist.

The patterned resist can then serve as a mask for the underlying layers which can then be selectively treated, such as to receive dopants and/or to undergo etching.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant process, mandrel material layer may be etched using RIE, for example.

FIG. 3 shows forming a spacer 148 around mandrel 146, and then removing mandrel 146, creating a mask 150, i.e., from spacer 148. Spacer 148 as mask 150 may include any now known or later developed spacer material used for SIT techniques such as silicon nitride. Spacer 148 may be formed by depositing the spacer material blankly on the surface, then etch-back until an upper surface of mandrel 146 is exposed with spacers 148 remaining around mandrel 146. Then, mandrel 146 may be removed using any appropriate etching technique for the mandrel material used. In contrast to conventional processing, spacers 148 on an end of mandrel 146 are not removed, leaving mask 150 with opposing looped ends. It is emphasized that mask 150 need not include two looped ends, where a single diffusion break (SDB) will only be used at one end of semiconductor fins.

FIG. 4 shows the structure after etching semiconductor substrate 110 using mask 150 (FIG. 3) to create pair of spaced semiconductor fins 120, 122 having ends 140 thereof coupled by the semiconductor connecting fin 142, creating the semiconductor fin loop 144. The etching removes a portion of substrate 110, hard mask 112 and mask 150, leaving hard mask 112 over the newly formed fins 120, 122, i.e., in areas under mask 150. Since mask 150 is formed from spacer 148, the image transfer results in fins 120, 122 and connecting fin 140 having sub-lithographic dimensions, e.g., <20 nm.

Figure 5:
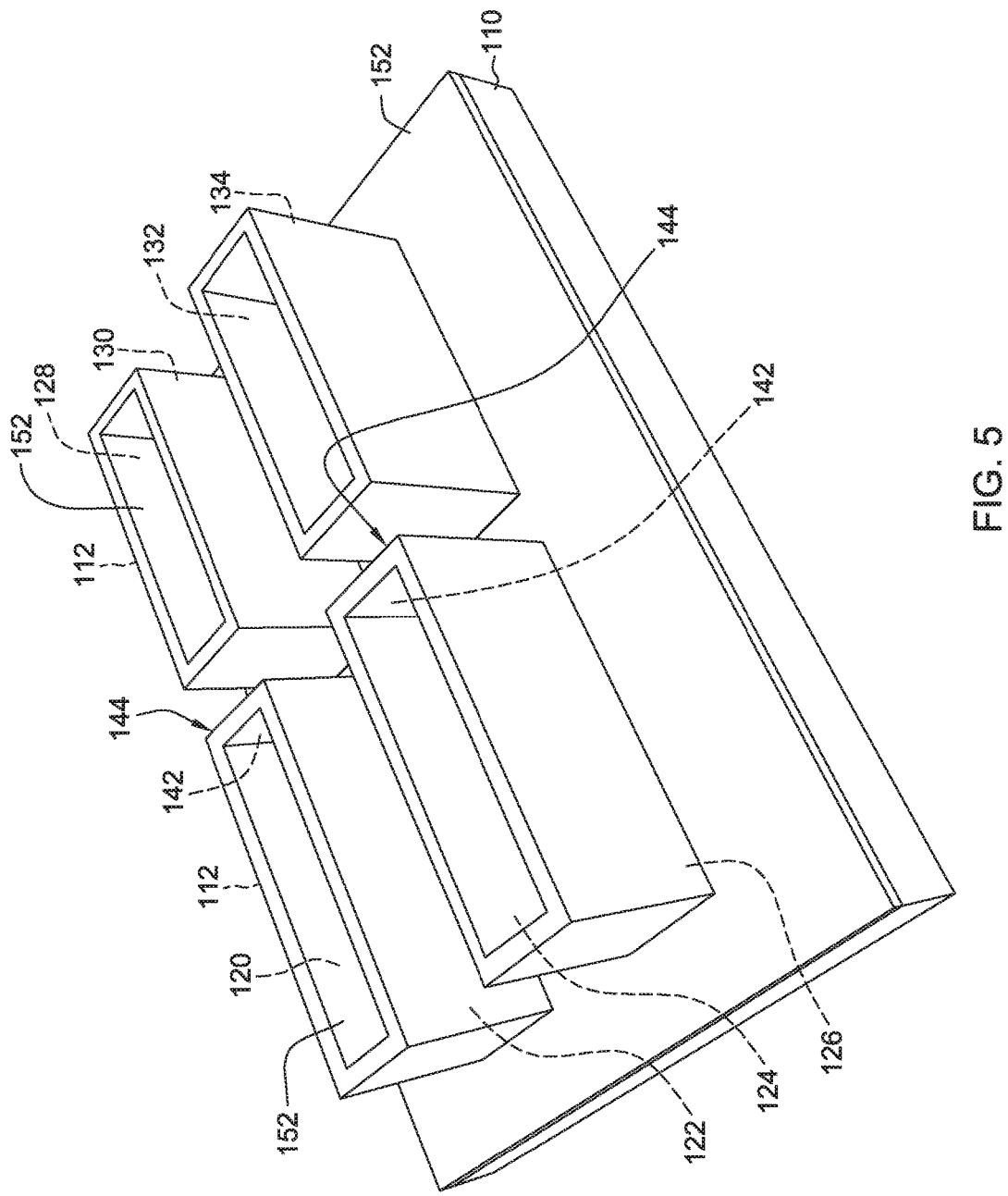
FIG. 5 shows a perspective view of forming a barrier layer over the FIG. 4 structure according to embodiments of the disclosure.

Continuing with the overall process, FIGS. 5-8 show perspective views of additional steps. FIG. 5 shows forming a barrier layer 152 (often referred to as a contact-etch-stop-layer (CESL)) over semiconductor fin loop 144, i.e., over fins 120, 122; 124, 126; 128, 130; and 132, 134; and over hard mask 112. Barrier layer 152 may include any now known or later developed barrier material such as but not limited to: silicon oxy-nitride (SiON), a silicon nitride and silicon oxide bilayer or a low dielectric (low-K) constant layer (K<3.9). As will be described herein, barrier layer 152 provides a layer to prevent damage to semiconductor connector fin 142 prior to formation of source/drain via epitaxy.

Figure 6:
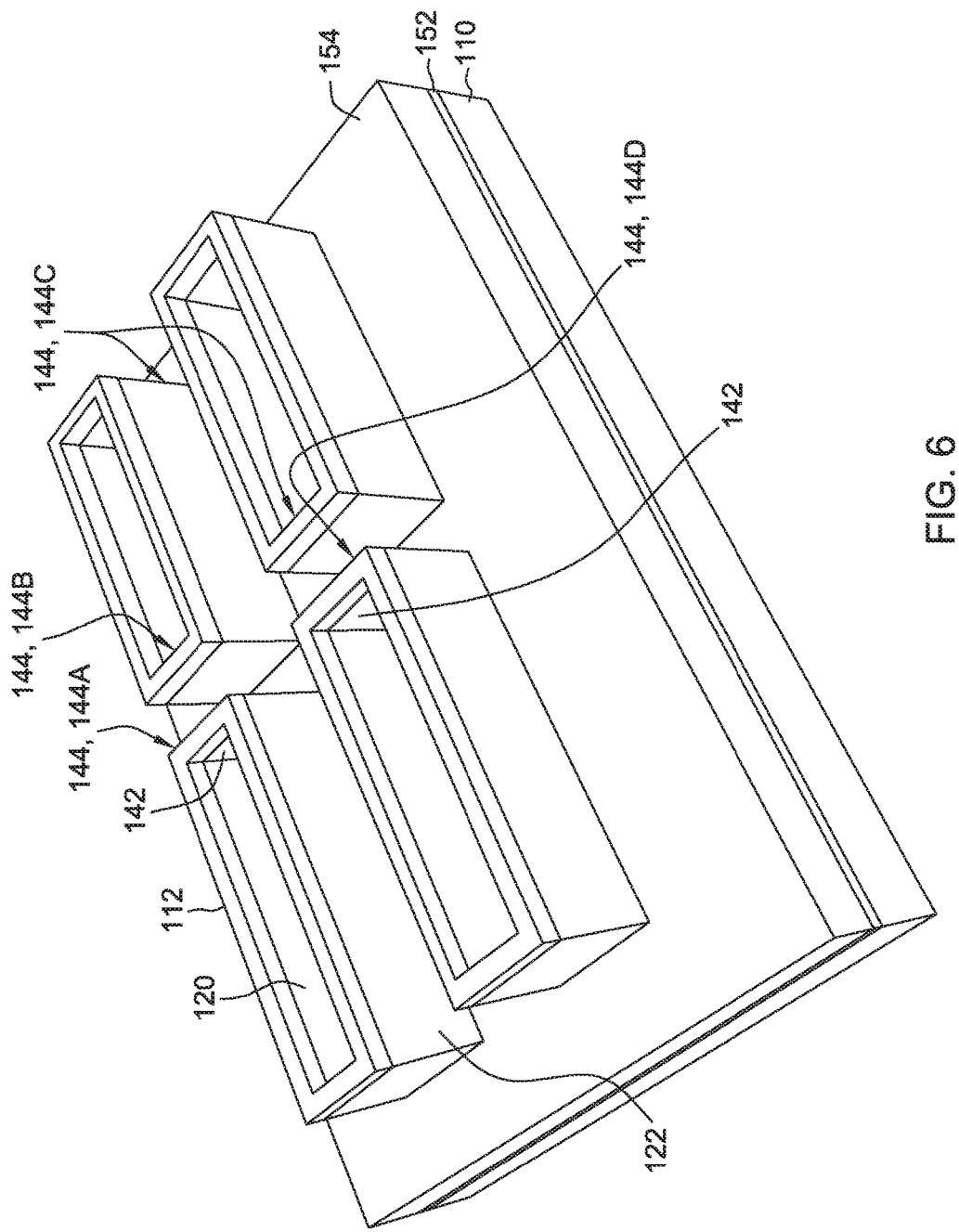
FIG. 6 shows a perspective view of forming an isolation region according to embodiments of the disclosure.

FIG. 6 shows forming an isolation region layer 154 about semiconductor fin loop 144. As understood in the field, isolation region layer 154 acts as a shallow trench isolation (STI) for finFETs formed from fins, e.g., 120, 122, to isolate one region of the substrate from an adjacent region of the substrate. One or more transistors of a given polarity may be disposed within an area isolated by STI. Isolation region layer 154 may be formed by, for example, depositing silicon oxide, annealing, and planarizing the silicon oxide (e.g. by CMP), then etching back (or recess) the silicon oxide to reveal fins, e.g., 120, 122 to a desired height (e.g., 30 nm-100 nm) using any appropriate masks necessary. Isolation region layer 154 may also be formed using alternative techniques understood in the art relative to STI formation for finFETs.

Figure 7:
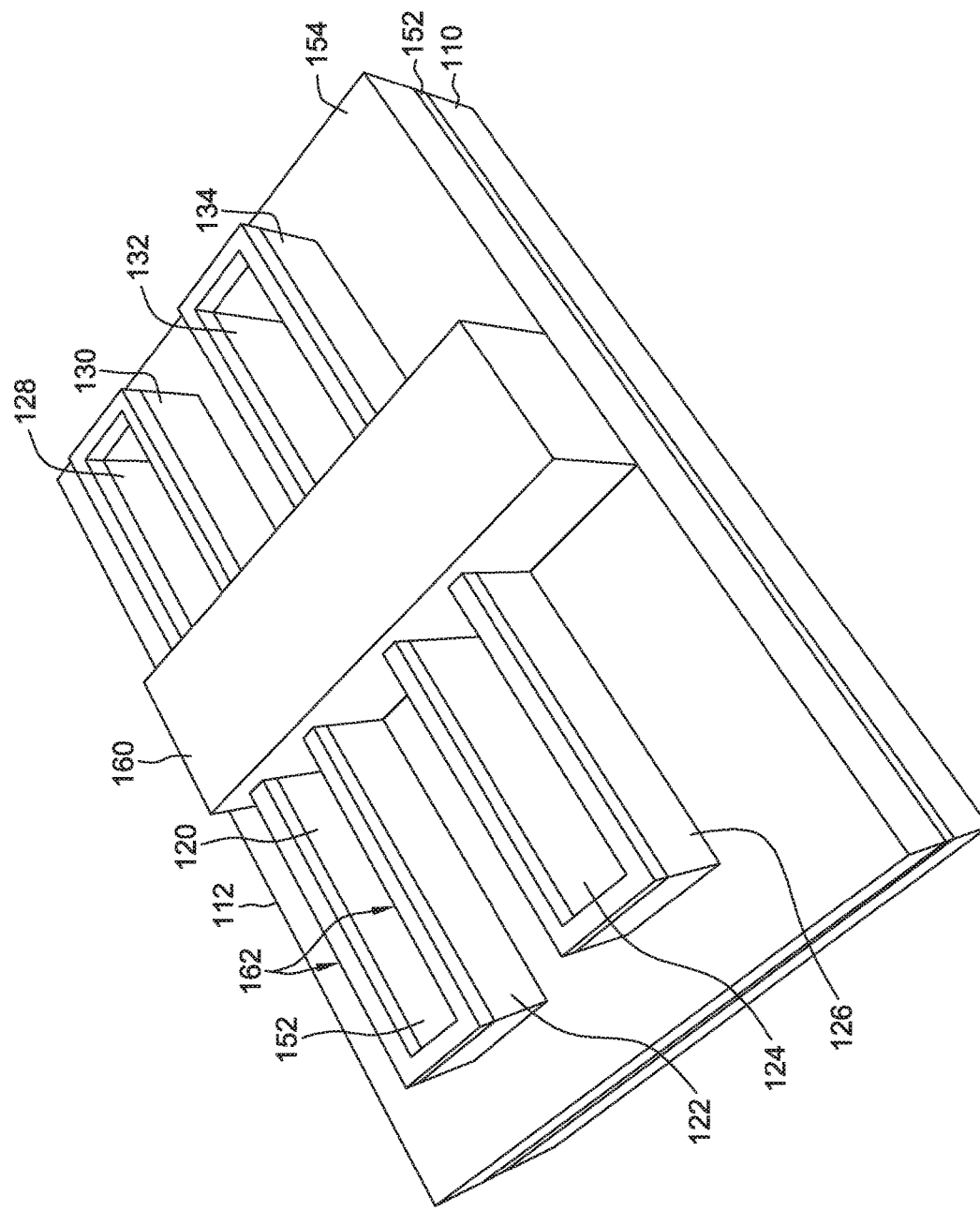
FIG. 7 shows a perspective view of forming a diffusion break over the semiconductor fin loop according to embodiments of the disclosure.

FIG. 7 shows forming a diffusion break 160 about semiconductor fin loop 144 (now buried within the diffusion break) and over isolation region layer 154, leaving an exposed portion 162 of the pair of spaced semiconductor fins, e.g., 120, 122. Diffusion break 160 may be referred to as a 'raised STI'. Diffusion break 160 may be formed by, for example, simply performing selective recessing (or etching back) in FIG. 6, i.e. adding a litho/mask before recessing isolation layer 154; then, after stripping the resist, resulting in diffusion break 160 (in FIG. 7). Diffusion break 160 may include, for example, silicon oxide. Referring again to FIG. 6, diffusion break 160 has a width defined by a spacing between adjacent semiconductor fin loops 144, e.g., 144A, 144B in FIG. 6. As shown, diffusion break 160 is constituted for a single diffusion break (SDB), but can be longer if desired.

Figure 8:
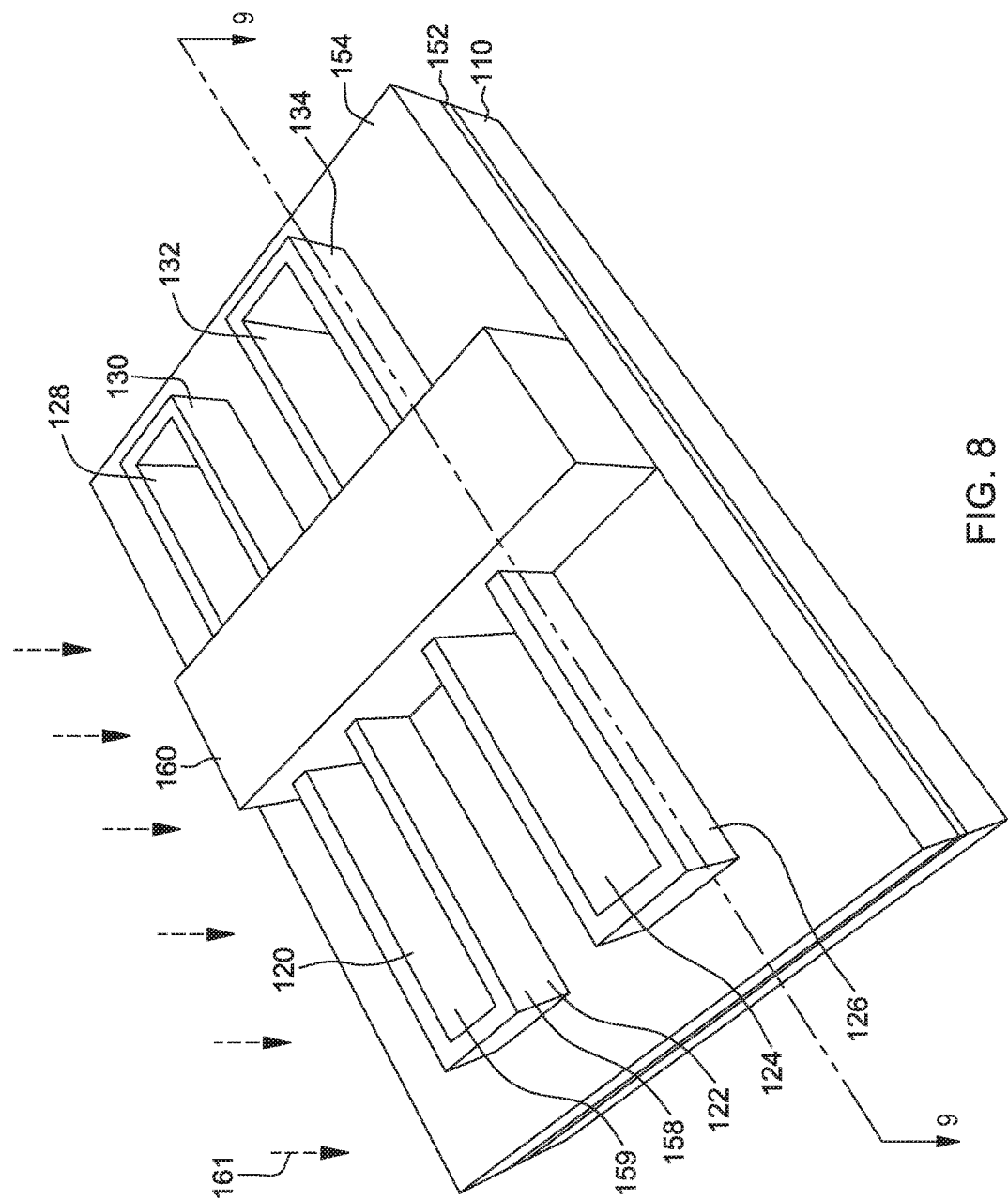
FIG. 8 shows a perspective view of the FIG. 7 structure with the barrier layer removed according to embodiments of the disclosure.
Figure 9:
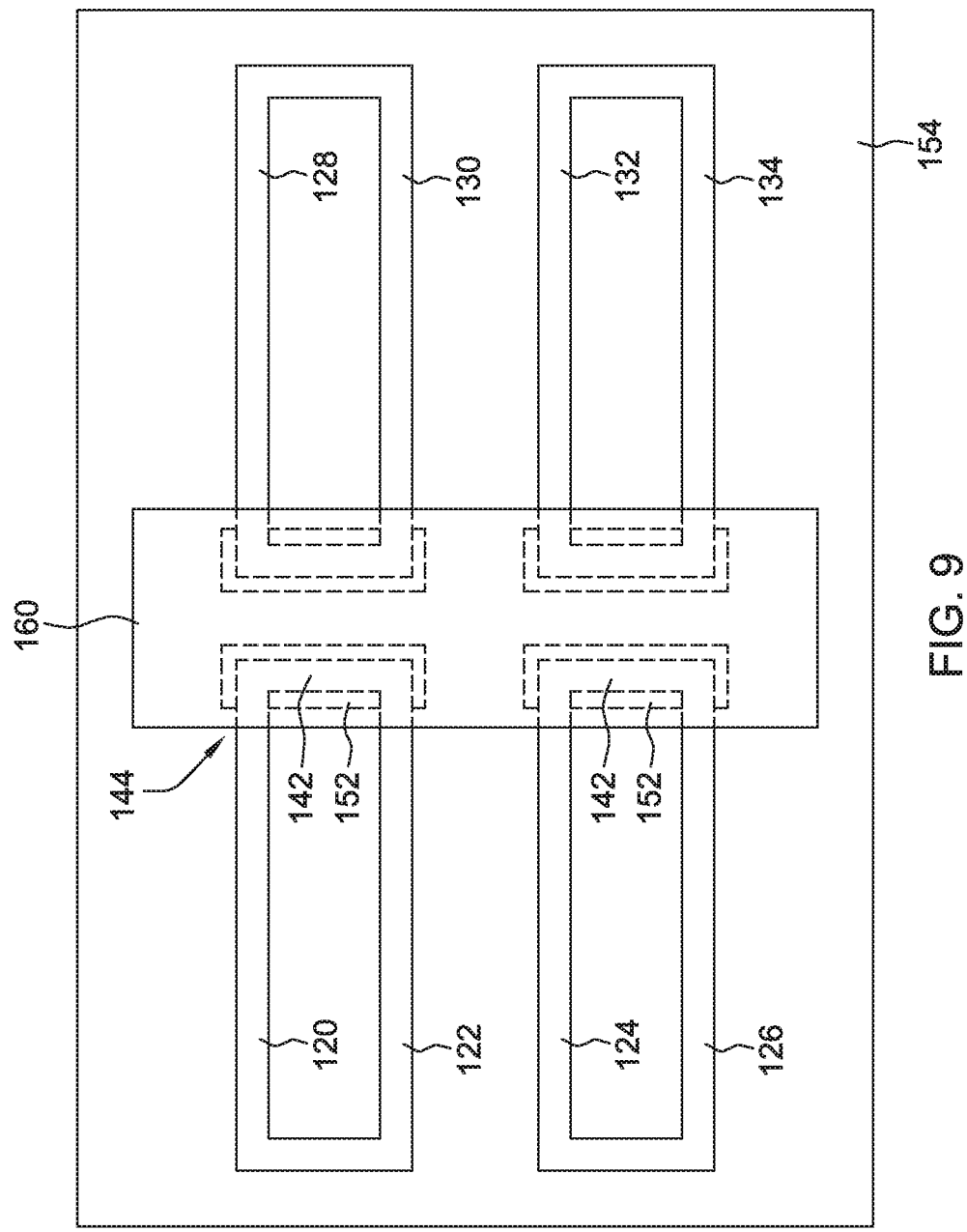
FIG. 9 shows a top view of the FIG. 8 structure.

FIG. 8 shows a perspective view of stripping barrier layer 152 from exposed portion 162 (FIG. 7) of pair of spaced semiconductor fins, e.g., 120, 122. Hard mask 112 may also be removed at this time. Barrier layer 152 may be stripped using any now known or later developed etching process selective to the material for barrier layer 152 employed. FIG. 9 shows a top view of FIG. 8 illustrating how semiconductor connecting fins 142 include barrier layer 152 thereabout within diffusion break 160. FIG. 8 also shows implantation for forming n/p wells 158, 159, e.g., by selectively patterning (mask to protect one area or another) and performing ion implantation 161 of n-type or p-type dopants, respectively, and then annealing. In addition, a mask for forming thicker oxide in IO areas or areas for analog circuits (not shown for simplicity) may be used so thicker oxide can be formed at this stage.

Figure 10:
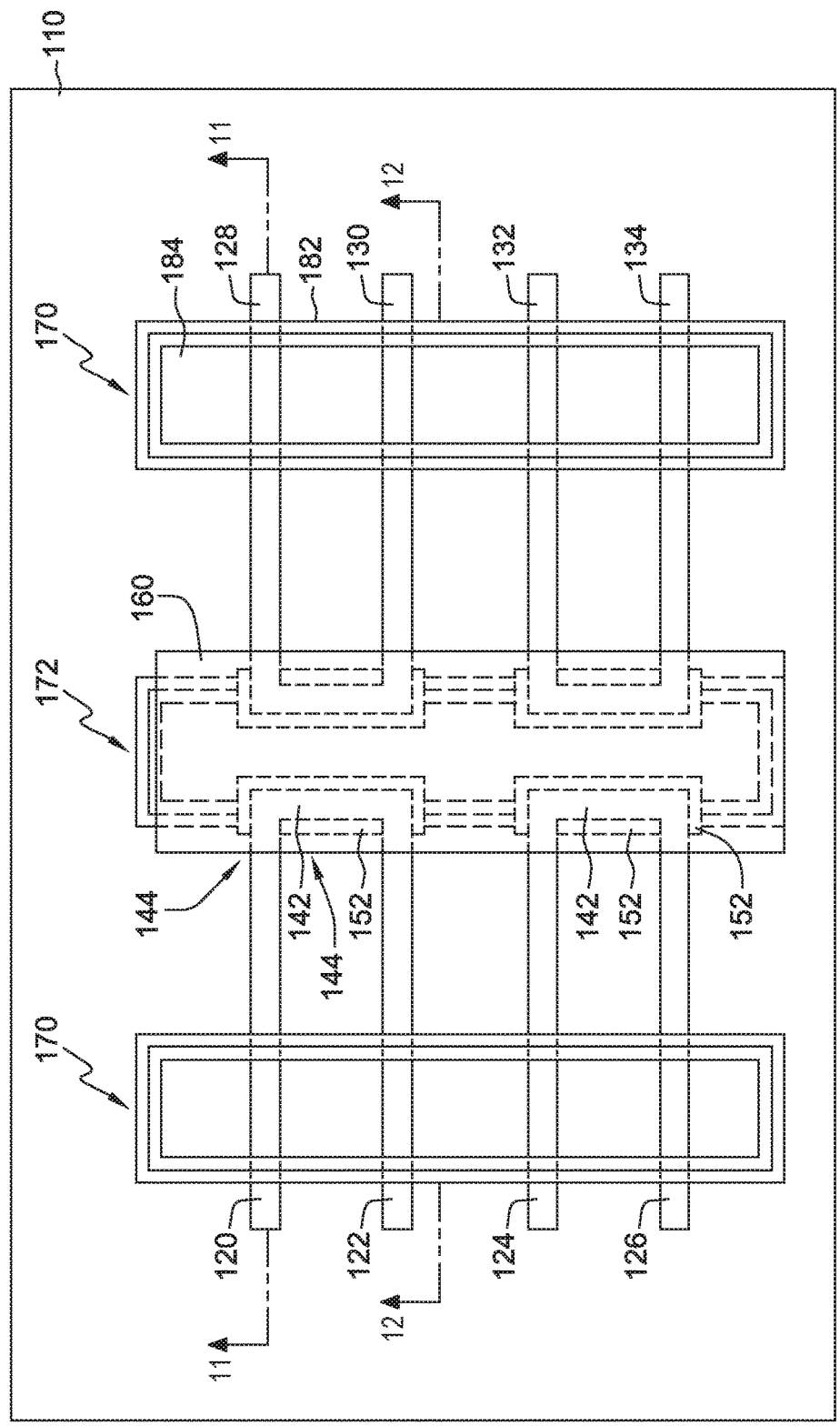
FIG. 10 shows a top view.
Figure 11:
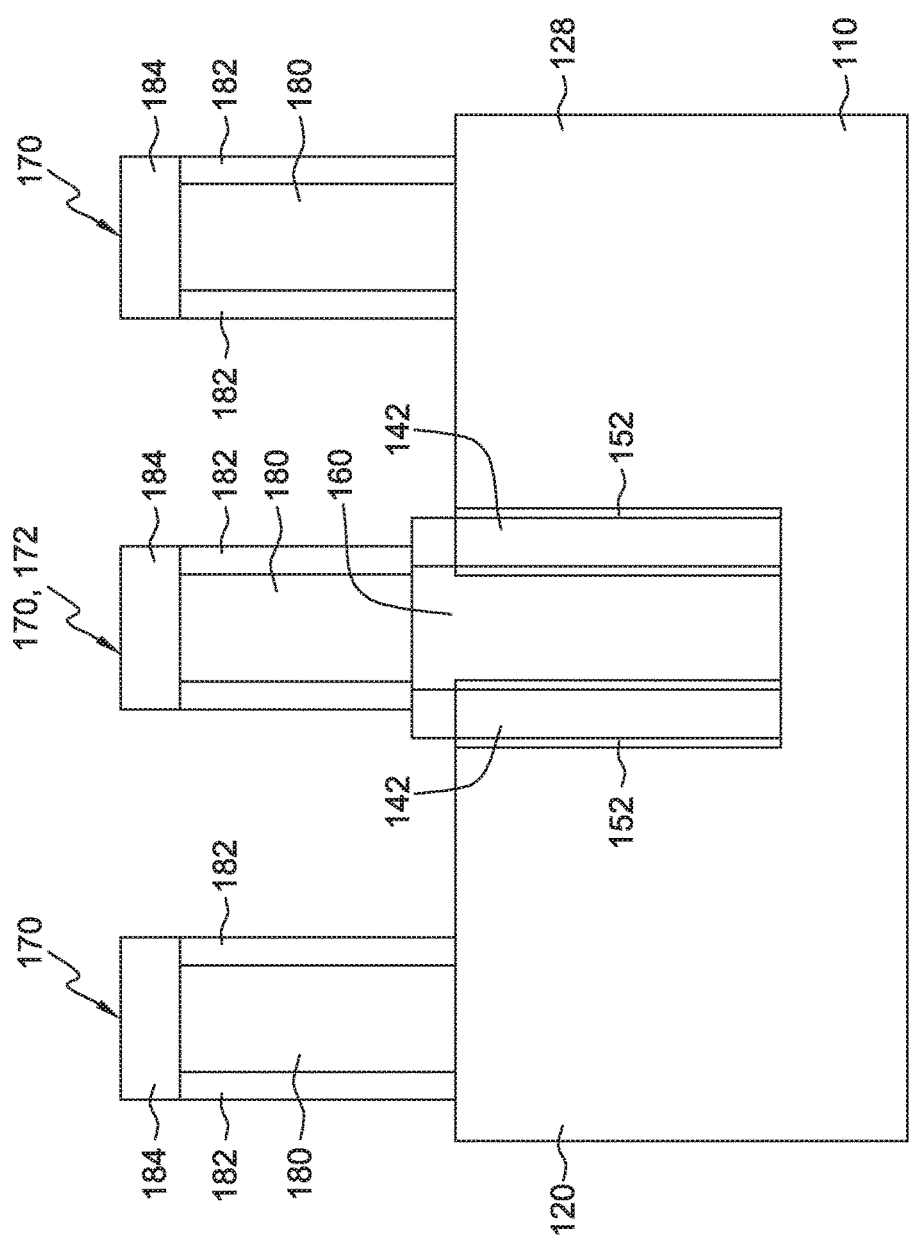
FIG. 11 shows a cross-sectional view along line 11-11 in FIG. 8.
Figure 12:
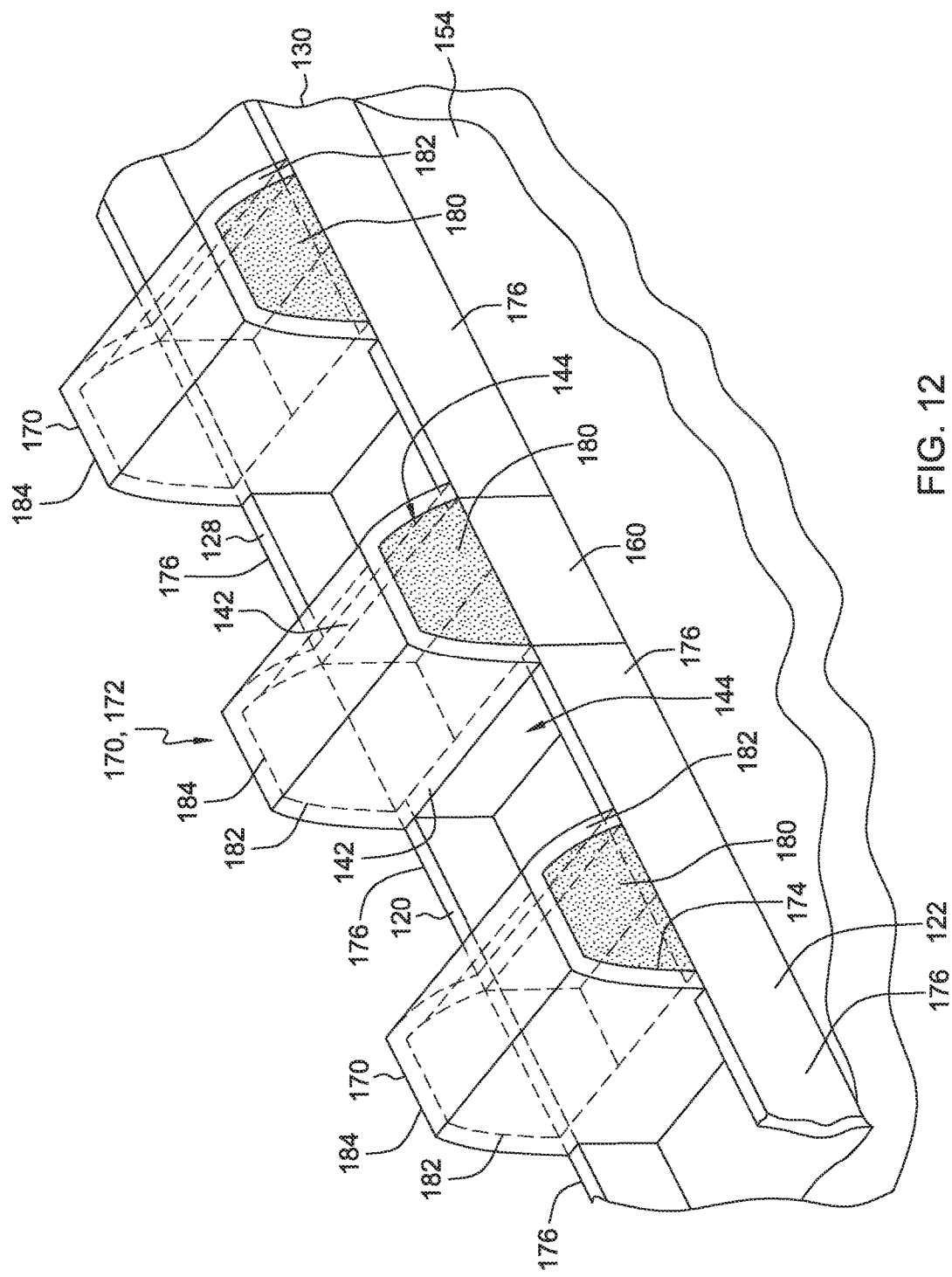
FIG. 12 shows a perspective view along line 12-12 in FIG. 8, of forming gate structures according to embodiments of the disclosure.
Figure 13:
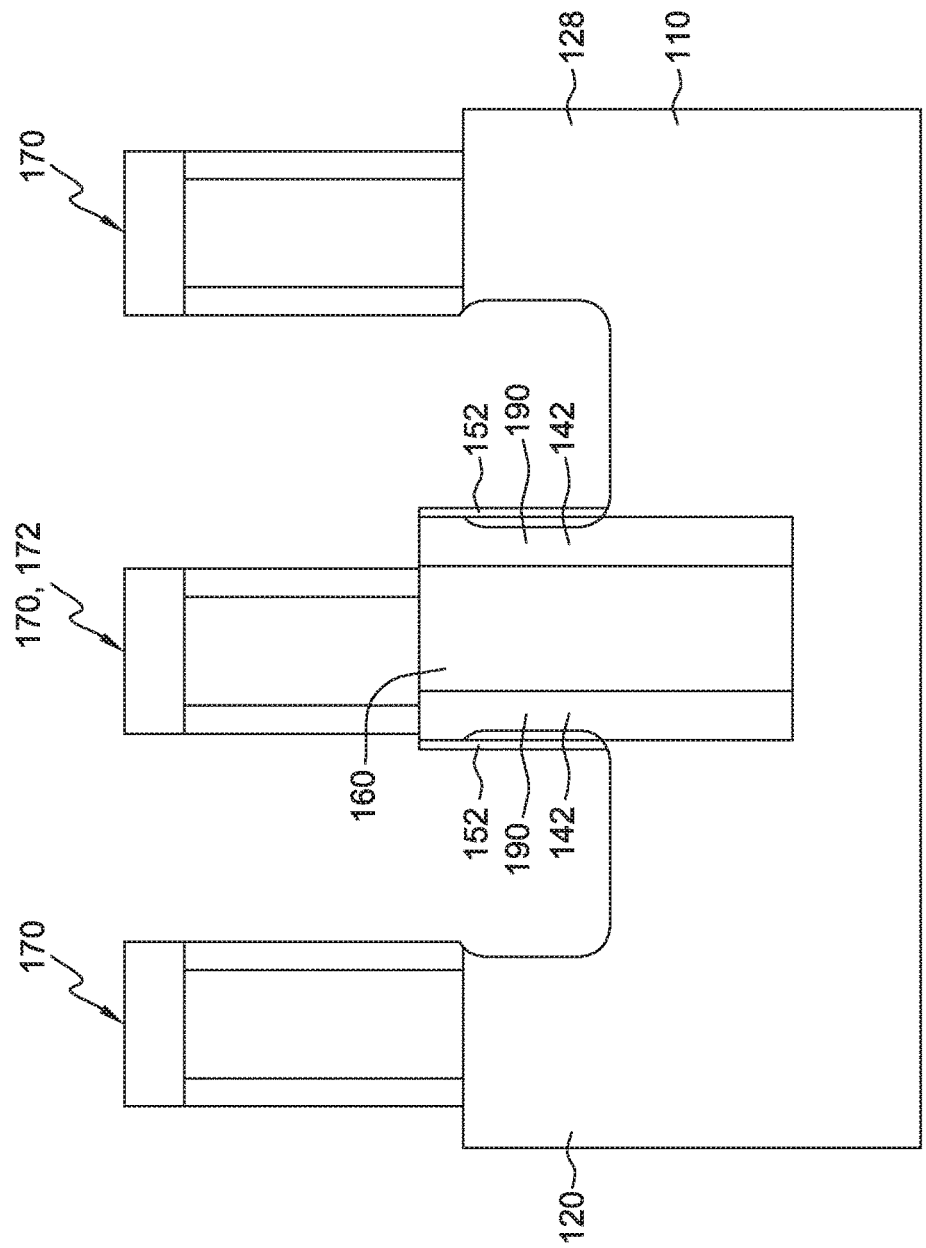
FIG. 13 shows a cross-sectional view.

FIG. 10 shows a top view (note, not all structures are shown in phantom for clarity), FIG. 11 shows a cross-sectional view and FIG. 12 shows a perspective view of forming a plurality of gate structures 170 over exposed portion 162 (FIG. 7) of pair of spaced semiconductor fins, e.g., 120, 122, and a dummy gate 172 over diffusion break 160 and semiconductor connecting fin 142. (Note: FIG. 10 includes lines 11-11 and 12-12 indicating the context of FIGS. 11 and FIG. 12. FIG. 12 only shows semiconductor fins 120, 122, 128, 130 for clarity.) Gate structures 170 may include any now known or later developed gate structures 170. The formation of the gate stack is well known to those skilled and not to be described here for simplicity. Here, dummy gate 172 extends over two semiconductor connector fins 142 of adjacent semiconductor fin loops 144A, 144B (FIG. 6), but that may not be necessary in all instances. For example, a semiconductor fin loop 144 may be employed adjacent a conventional set of separated semiconductor fins. As shown in FIG. 13, dummy gate 172 may be formed over diffusion break 160 in a misaligned manner. That is, a center-line of dummy gate 172 does not align with a center-line of diffusion break 160. As will be described herein, this misalignment does not impact the epitaxy growth processes for source/drains (later) described herein because of the presence of semiconductor connecting fin 142.

Figure 14:
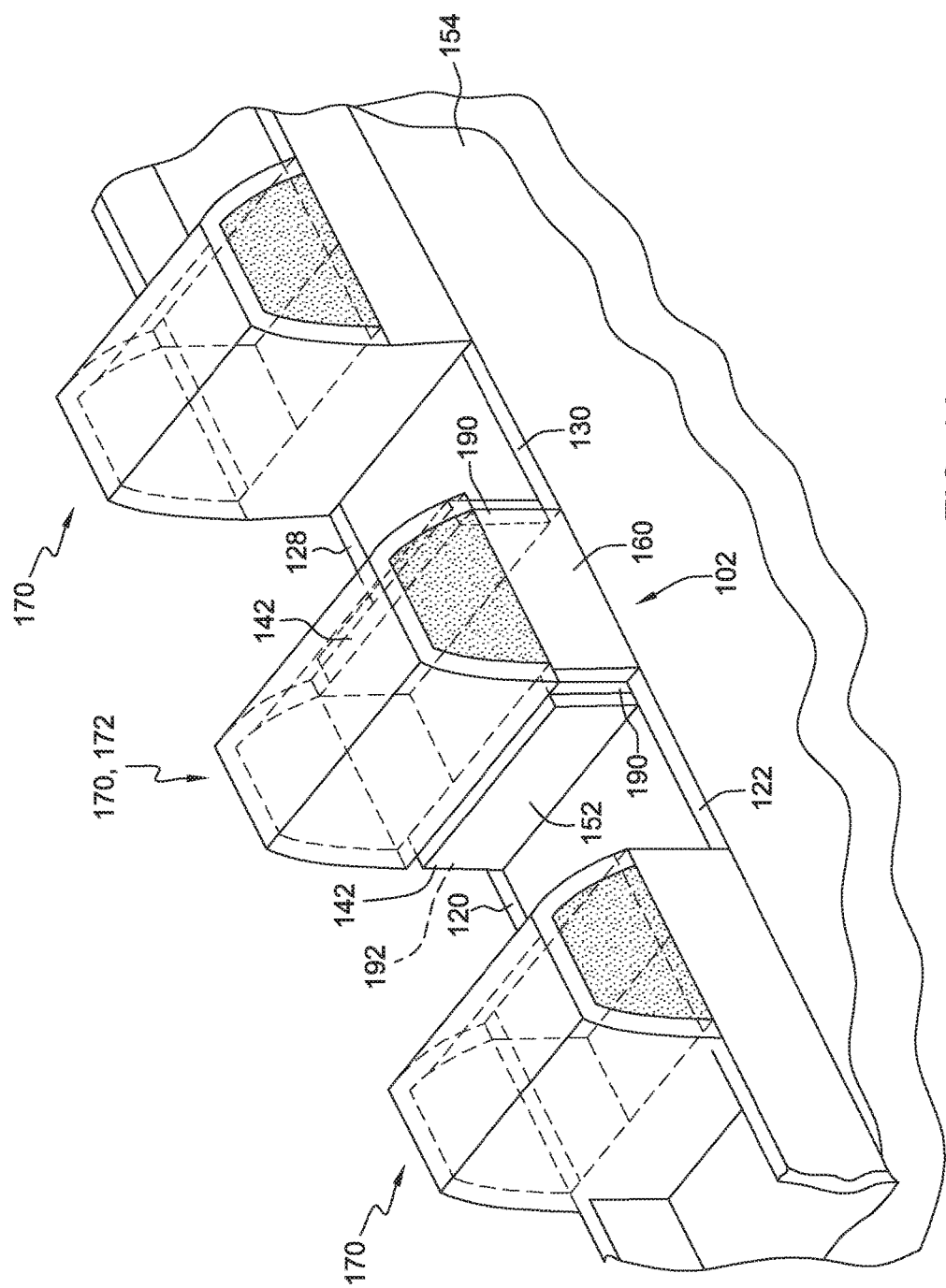
FIG. 14 shows a perspective view of a source/drain recessing according to embodiments of the disclosure.

After forming plurality of gate structures 170, at least one of a source and a drain are formed. More specifically, a source or a drain are expanded to provide a larger area upon which to land a source/drain contact. FIG. 13 shows a cross-sectional view (same context as FIG. 11) and FIG. 14 shows a perspective view, of this process. As illustrated, an etching is performed of an exposed part 176 (FIG. 12) of pair of spaced semiconductor fins, e.g., 120, 122, 128, 130, between pairs of plurality of gate structures 170 including adjacent to dummy gate 172. The etching may be as deep into fins 120, 122, 128, 130, as desired for the particular technology node. In any event, as shown in FIGS. 13 and 14, the etching also removes ends of spaced semiconductor fins 142 abutting end faces 190, 192 of semiconductor connecting fin 142 and under dummy gate 172. As a result, end faces 190, 192 of semiconductor connecting fin 142 are exposed, which exposes semiconductor material (e.g., Si) thereof from which epitaxial growth may occur in a nearly ideal manner. Barrier layer 152 extends along longitudinal sides of semiconductor connecting fin 142, protecting it from the etching.

Figure 15:
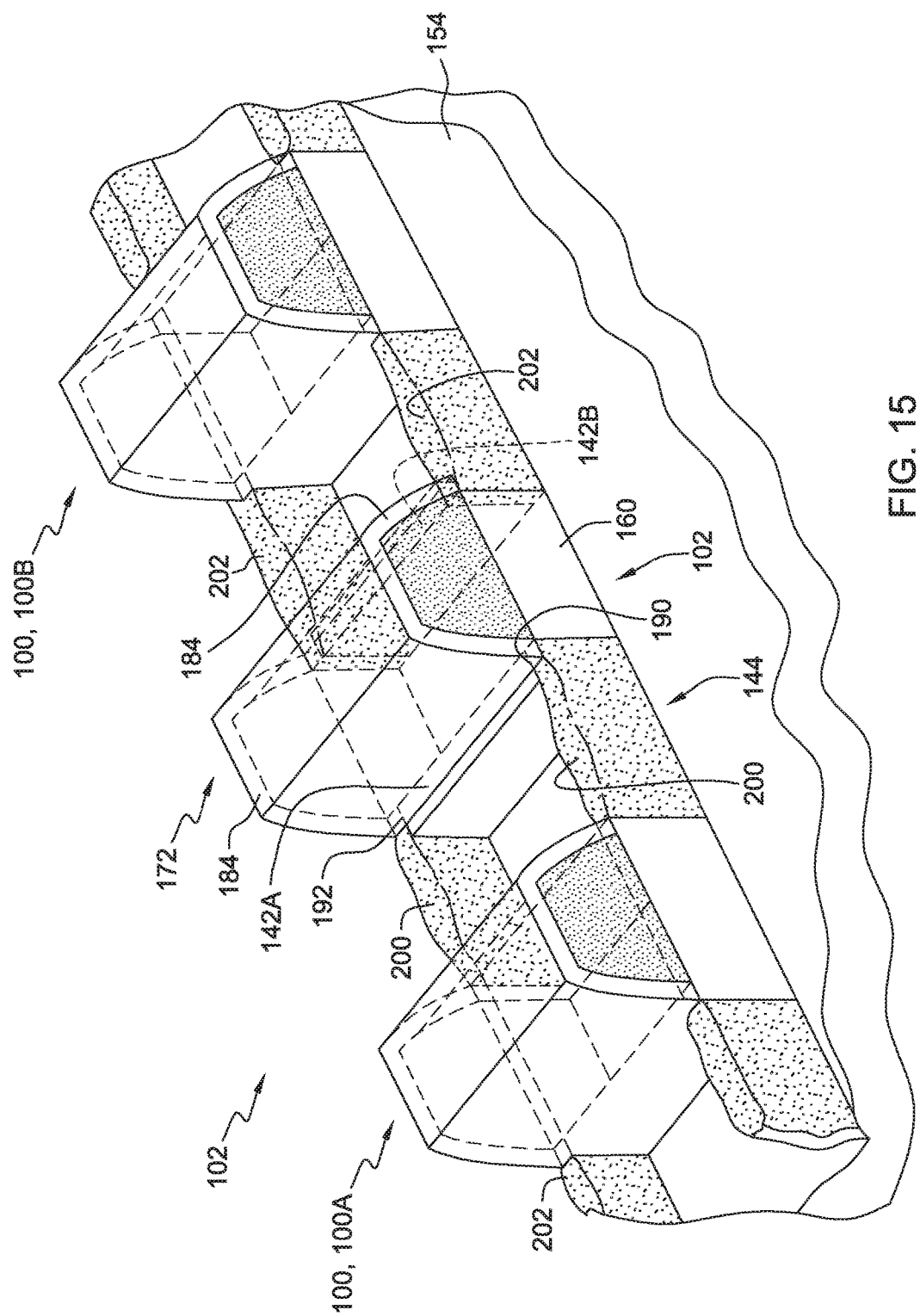
FIG. 15 shows a perspective view of a finFET and an IC structure after a source/drain epitaxial growth, according to embodiments of the disclosure.
Figure 16:
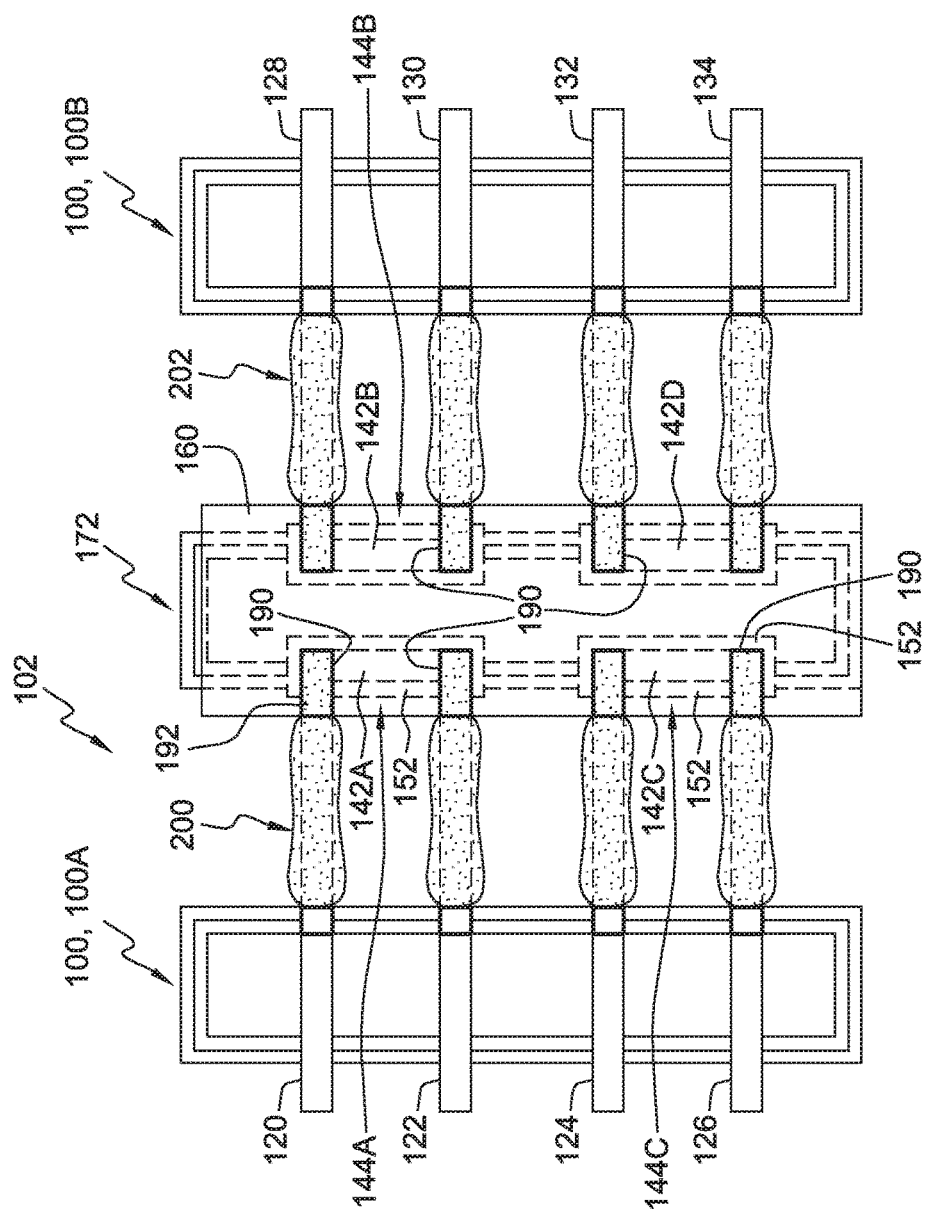
FIG. 16 shows a top view of a finFET and an IC structure after a source/drain epitaxial growth, according to embodiments of the disclosure.

FIG. 15 shows a perspective view and FIG. 16 shows a top view of epitaxially growing semiconductor material from pair of spaced semiconductor fins 120, 122 or 128, 130, and end faces 190, 192 of semiconductor connecting fin 142 to form the at least one of source 200 or drain 202. The epitaxial growth may be in-situ doped with an appropriate n-type or p-type dopant. Dopants are introduced into semiconductor to establish either p-type (acceptors) or n-type (donors) conductivity: common dopants in silicon: for p-type—boron (B), Indium (In); for n-type—phosphorous (P) arsenic (As), antimony (Sb). As shown, diffusion break 160 isolates source 200 or drain 202, i.e., from other source/drains of adjacent finFETs, and is positioned about first semiconductor connector fin 142 and ends of semiconductor fins 120, 122 or 128, 130.

As described, semiconductor fin loop 144 (FIG. 12) and in particular, semiconductor connector fin 142 provide an epitaxial growth surface (end faces 190, 192) adjacent diffusion break 160 that address any misalignment of dummy gate 172 (see FIG. 13) or over-etching of fins adjacent diffusion break 160. Specifically, semiconductor fin loop 144 allows for formation of diffusion break 160 over the loop. When a dummy gate 172 is formed thereover and later used for etching fins 120, 122 for subsequent source/drain epitaxial growth, semiconductor connector fin 142 remains present under dummy gate 172. End faces 190, 192 of semiconductor connector fin 142 thus remain present for source/drain epitaxial growth despite the ends of the semiconductor fins, e.g., 120, 122, having been etched in such a way that ideal source/drain epitaxy will not occur therefrom, e.g., by too little or no semiconductor fin remaining under the dummy gate. End faces 190, 192 of semiconductor connector fin 142 function even if dummy gate 172 is misaligned over diffusion break 160.

FIGS. 15 and 16 also show embodiments of a finFET 100 (left side 100A or right side 100B) and IC structure 102 according to embodiments of the disclosure. As noted, pair of semiconductor fins 120, 122; 124, 126; 128, 130; and/or 132, 134 can be used to form of a variety of finFETs, e.g., a double fin, single finFETs for logic gates, or a four-fin, single finFETs for memory cells, among other finFET structures. With reference to the left side finFET 100A, the finFET may include a source 200 or a drain 202 (same as shown for right side finFET 100B) including: a first semiconductor fin 120 extending parallel to a second semiconductor fin 122, and a first semiconductor connector fin 142A creating a first semiconductor fin loop 144A by connecting an end of first semiconductor fin 120 to an end of second semiconductor fin 122. A diffusion break 160 isolates the source or the drain, i.e., from an adjacent finFET's drain or source. Diffusion break 160 is positioned about first semiconductor connector fin 142 and ends of first semiconductor fin 120 and second semiconductor fin 122. Semiconductor connector fin 142 may include a first end face 192 abutting a side portion of the end of first semiconductor fin 120, and an opposing, second end face 180 abutting a side portion of the end of second semiconductor fin 122. Further, semiconductor connector fin 142 may include a barrier layer 152 (FIGS. 12) over at least a portion of each longitudinal side thereof. Each end of first and second semiconductor fins 120, 122 thus includes a semiconductor material epitaxially grown, in part, from a respective end face 192, 190 of semiconductor connector fin 142. A dummy gate 172 may be positioned over first diffusion break 160 such that semiconductor connector fin 142 extends under a portion of dummy gate 172, e.g., at least spacer 184 thereof. As noted and shown in FIG. 13, dummy gate 172 may be misaligned over diffusion break 160.

As can be appreciated from FIG. 16, a finFET 100 may also include a third semiconductor fin 124 extending parallel to a fourth semiconductor fin 126, and another semiconductor connector fin 142C creating another semiconductor fin loop 144C by connecting an end of the third semiconductor fin 124 to an end of fourth semiconductor fin 126. Diffusion break 160 may isolate the source or the drain thereof from a drain or source of an adjacent finFET 100B. Diffusion break 160 may be positioned about second semiconductor connector fin 142B and the ends of third semiconductor fin 124 and fourth semiconductor fin 126. First, second, third and fourth semiconductor fins 120, 122, 124, 126 may be operatively coupled together, e.g., by the merging of epitaxial growth of source/drains or through other interconnects such as source/drain contacts and metal wires, forming a four fin, single transistor. Semiconductor fins 128, 130, 132, 134 may be similarly formed and interconnected.

In another embodiment, as shown in FIG. 15, IC structure 102 may include a source 200 of a first finFET 100A including a first pair of semiconductor fins 120, 122 having ends thereof connected by a first semiconductor connector fin 142A, and a drain 202 of a second finFET 100B including a second pair of semiconductor fins 128, 130 having ends thereof connected by a second semiconductor connector fin 142B. A single diffusion break (SDB) 160 isolates source 200 and drain 202 and extends along sides of each of the first and second semiconductor connector fins 142A, 142B. Each semiconductor connector fins 142A, 142B each include a barrier layer 152 over at least a portion of each longitudinal side thereof. As noted, source 200 and drain 202 include a semiconductor material epitaxially grown, in part, from the end face 190, 192 of semiconductor connector fins 142A, 142B. Dummy gate 172 extends over SDB 160, and semiconductor connector fins 142A, 142B may extend under a portion of dummy gate 172. Dummy gate 172 may be misaligned over SDB 160. Each of first and second semiconductor connector fins 120, 122 may include: a first end face 190 abutting a side portion of the end of one of the respective pair of semiconductor fins 122, 130, and an opposing, second end face 192 abutting a side portion of the end of the other one of the respective pair of semiconductor fins 120, 128. As shown in FIG. 16, in another embodiment, source 200 of first finFET 100A may include a third pair of semiconductor fins 124, 126 having ends thereof connected by a third semiconductor connector fin 142C, and drain 202 of second finFET 100B may include a fourth pair of semiconductor fins 132, 134 having ends thereof connected by a fourth semiconductor connector fin 142D. First and third pair of semiconductor fins 120, 122, 124, 126 may be operatively coupled together and second and fourth pair of semiconductor fins 128, 130, 132, 234 may be operatively coupled together, forming two "four-fin" transistors separated by SDB 160.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/− 10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A fin-type field effect transistor (finFET), comprising:
   a source or a drain including:
     a first semiconductor fin extending parallel to a second semiconductor fin, and
     a first semiconductor connector fin creating a first semiconductor fin loop by connecting an end of the first semiconductor fin to an end of the second semiconductor fin;
   a first diffusion break isolating the source or the drain, the first diffusion break positioned about the first semiconductor connector fin and the ends of the first semiconductor fin and the second semiconductor fin; and
   a dummy gate over the first diffusion break, wherein the first semiconductor connector fin extends under a portion of the dummy gate.

2. The finFET of claim 1, wherein the dummy gate is misaligned over the first diffusion break.

3. The finFET of claim 1, wherein the first semiconductor connector fin includes:
   a first end face abutting a side portion of the end of the first semiconductor fin, and
   an opposing, second end face abutting a side portion of the end of the second semiconductor fin.

4. The finFET of claim 3, wherein each end of the first and second semiconductor fins includes a semiconductor material epitaxially grown, in part, from a respective first and second end face of the first semiconductor connector fin.

5. The finFET of claim 1, wherein the first semiconductor connector fin includes a barrier layer over at least a portion of each longitudinal side thereof.

6. The finFET of claim 1, wherein the source or the drain further includes:
   a third semiconductor fin extending parallel to a fourth semiconductor fin, and
   a second semiconductor connector fin creating a second semiconductor fin loop by connecting an end of the third semiconductor fin to an end of the fourth semiconductor fin; and
   wherein the diffusion break is also positioned about the second semiconductor connector fin and the ends of the third semiconductor fin and the fourth semiconductor fin,
   wherein the first, second, third and fourth semiconductor fins are operatively coupled together.

7. An integrated circuit (IC) structure, comprising:
   a source of a first fin-type field effect transistor (finFET) including a first pair of semiconductor fins having ends thereof connected by a first semiconductor connector fin;

a drain of a second finFET including a second pair of semiconductor fins having ends thereof connected by a second semiconductor connector fin;

a single diffusion break (SDB) isolating the source and the drain, the SDB extending along sides of each of the first and second semiconductor connector fins; and a dummy gate over the single diffusion break.

8. The IC structure of claim 7, wherein the first and second semiconductor connector fins each include a barrier layer over at least a portion of each longitudinal side thereof.

9. The IC structure of claim 7, wherein the source and the drain each include a semiconductor material epitaxially grown, in part, from end faces of a respective semiconductor connector fin.

10. The IC structure of claim 7, wherein the semiconductor connector fins extend under a portion of the dummy gate.

11. The IC structure of claim 7, wherein the dummy gate is misaligned over the single diffusion break.

12. The IC structure of claim 7, wherein each of the first and second semiconductor connector fins includes:

a first end face abutting a side portion of the end of one of the respective pair of semiconductor fins, and an opposing, second end face abutting a side portion of the end of the other one of the respective pair of semiconductor fins.

13. The IC structure of claim 7, wherein:

the source of the first finFET includes a third pair of semiconductor fins having ends thereof connected by a third semiconductor connector fin; and the drain of the second finFET includes a fourth pair of semiconductor fins having ends thereof connected by a fourth semiconductor connector fin;

wherein the first and third pair of semiconductor fins are operatively coupled together and the second and fourth pair of semiconductor fins are operatively coupled together.

* * * * *